(12) United States Patent
Sidhu et al.

(10) Patent No.: US 8,701,281 B2
(45) Date of Patent: Apr. 22, 2014

(54) SUBSTRATE METALLIZATION AND BALL ATTACH METALLURGY WITH A NOVEL DOPANT ELEMENT

(75) Inventors: Rajen S. Sidhu, Chandler, AZ (US); Ashay A. Dani, Chandler, AZ (US); Mukul P. Renavikar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 297 days.

(21) Appl. No.: 12/641,237

(22) Filed: Dec. 17, 2009

(65) Prior Publication Data

US 2011/0147066 A1 Jun. 23, 2011

(51) Int. Cl.
| | |
|---|---|
| H05K 3/00 | (2006.01) |
| H05K 3/34 | (2006.01) |
| H05K 1/03 | (2006.01) |
| H05K 1/00 | (2006.01) |
| H05K 1/16 | (2006.01) |
| H05K 7/10 | (2006.01) |

(52) U.S. Cl.
USPC ............... 29/843; 29/840; 174/255; 174/258; 174/260; 361/767; 361/771

(58) Field of Classification Search
USPC .......... 174/255, 260, 261, 256–259; 257/737, 257/742, 779; 361/767–771, 783; 29/840, 29/843; 438/537, 541–542
See application file for complete search history.

(56) References Cited

U.S. PATENT DOCUMENTS

| | | | | |
|---|---|---|---|---|
| 5,346,118 | A * | 9/1994 | Degani et al. ............ | 228/180.22 |
| 6,179,198 | B1 * | 1/2001 | Eifuku et al. ............ | 228/180.22 |
| 6,307,160 | B1 * | 10/2001 | Mei et al. ...................... | 174/256 |
| 6,335,104 | B1 * | 1/2002 | Sambucetti et al. .......... | 428/615 |
| 6,740,823 | B2 * | 5/2004 | Shimizu ........................ | 174/260 |
| 7,122,460 | B2 * | 10/2006 | Hua ............... | 438/614 |
| 7,205,221 | B2 * | 4/2007 | Akram et al. ................ | 438/612 |
| 7,224,067 | B2 * | 5/2007 | Suh ............... | 257/772 |
| 7,309,647 | B1 * | 12/2007 | Nguyen ........................ | 438/612 |
| 7,321,140 | B2 * | 1/2008 | Li et al. ...................... | 257/203 |
| 2003/0157342 | A1 * | 8/2003 | Myers et al. ................ | 428/447 |
| 2005/0100474 | A1 * | 5/2005 | Huang et al. ................ | 420/560 |
| 2006/0060639 | A1 * | 3/2006 | Byrne et al. ............ | 228/248.1 |
| 2006/0067852 | A1 * | 3/2006 | Suh et al. ...................... | 420/555 |
| 2006/0196579 | A1 * | 9/2006 | Skipor et al. ................ | 148/24 |
| 2006/0211167 | A1 * | 9/2006 | Knickerbocker et al. ..... | 438/106 |
| 2007/0080451 | A1 * | 4/2007 | Suh ............... | 257/737 |
| 2007/0123020 | A1 * | 5/2007 | Jungnickel et al. .......... | 438/612 |
| 2008/0128476 | A1 * | 6/2008 | Wang et al. ................ | 228/256 |
| 2009/0057378 | A1 * | 3/2009 | Hwang et al. ............ | 228/248.1 |
| 2009/0081830 | A1 * | 3/2009 | Omandam et al. ............ | 438/118 |

* cited by examiner

*Primary Examiner* — Timothy Thompson
*Assistant Examiner* — Sherman Ng
(74) *Attorney, Agent, or Firm* — Blakely, Sokoloff, Taylor & Zafman LLP

(57) ABSTRACT

Surface-active dopants are added to a portion of a circuit package before a reflow process to promote wetting and reduce the formation of solder bump bridges. The circuit package has a solder element that electrically connects the circuit package to a substrate. A reflow process is performed to attach the solder element to a pad on the circuit package. During the reflow process, the surface-active dopants diffuse to the surface of the solder element and form an oxide passivation layer on the surface of the solder element.

7 Claims, 6 Drawing Sheets

SUBSTRATE METALLIZATION AND BALL ATTACH METALLURGY WITH A NOVEL DOPANT ELEMENT

BACKGROUND

1. Field

Technology for interconnecting integrated circuitry, packages and printed circuit boards.

2. Background

In metallurgy, "wetting" refers to the ability of a liquid to maintain contact with a solid surface. Wetting is an important factor in bonding two materials. When bonding a circuit package with a carrier (e.g., a printed circuit board), solder paste may be used to temporarily hold the solder balls (or solder bumps) on the circuit package to the board. A reflow process can be performed to melt the solder balls (or solder bumps), which form solder joints after the molten solder is cooled. The solder joints provide an electrical and mechanical connection between the package and the board.

During the reflow process, circuit packages often experience various degrees of warpage as the temperature changes. The changing degrees of warpage can be referred to as "dynamic warpage." Dynamic warpage is often the cause of non-wet joints, which means the solder balls fail to properly adhere to the surface of the board. For example, during the surface mount (SMT) reflow, dynamic warpage usually results in insufficient time for the flux to clean off the oxide and residue layer on the solder balls to form proper solder joints. As such, the formation of non-wet solder joints may occur.

Further, dynamic warpage can result in an inadequate flux and solder ball contact. The inadequate flux and solder ball contact can cause non-uniform collapse of the solder balls during the reflow. Thus, solder balls that are not in contact with the board during a period of reflow may have an increased oxide surface layer. When the warpage changes to force these solder balls back in contact with the board, adjacent solder balls may be squeezed out and form a bridge, which is referred to as a solder bump bridge.

On a surface having poor wetting characteristics (e.g., a heavily oxidized solder surface), molten solder may spread during reflow and two adjacent solder bumps may melt into each other to form a solder bump bridge. Solder bump bridging may be the cause of a short circuit.

FIG. 1 illustrates an example of a surface mount (SMT) reflow process 180, in which a circuit package 100 is to be electrically and mechanically bonded to a print circuit board 120 through an array of solder bumps 130. During the reflow, mismatch in thermal expansions causes circuit package 100 to warp. For example, circuit package 100 may initially bulge at the center and then bend into a saddle shape as the heat increases. Solder bumps 130 are oxidized during the reflow, which act as a barrier that prevents proper wetting. As a result, the formation of a non-wet joint 150 may occur. Further, a solder bump bridge 160 may be formed as a result of the dynamic warpage. The non-wet joint and solder bump bridging can result in failures of the circuit package or the board.

Conventionally, the problem of non-wet joint and solder bump bridging is solved by modifying the reflow process. For example, the volume of solder paste can be increased, or the heat profile of the reflow can be modified. However, the conventional solutions have had minimal success, with an increased risk for other issues, such as solder bridging.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
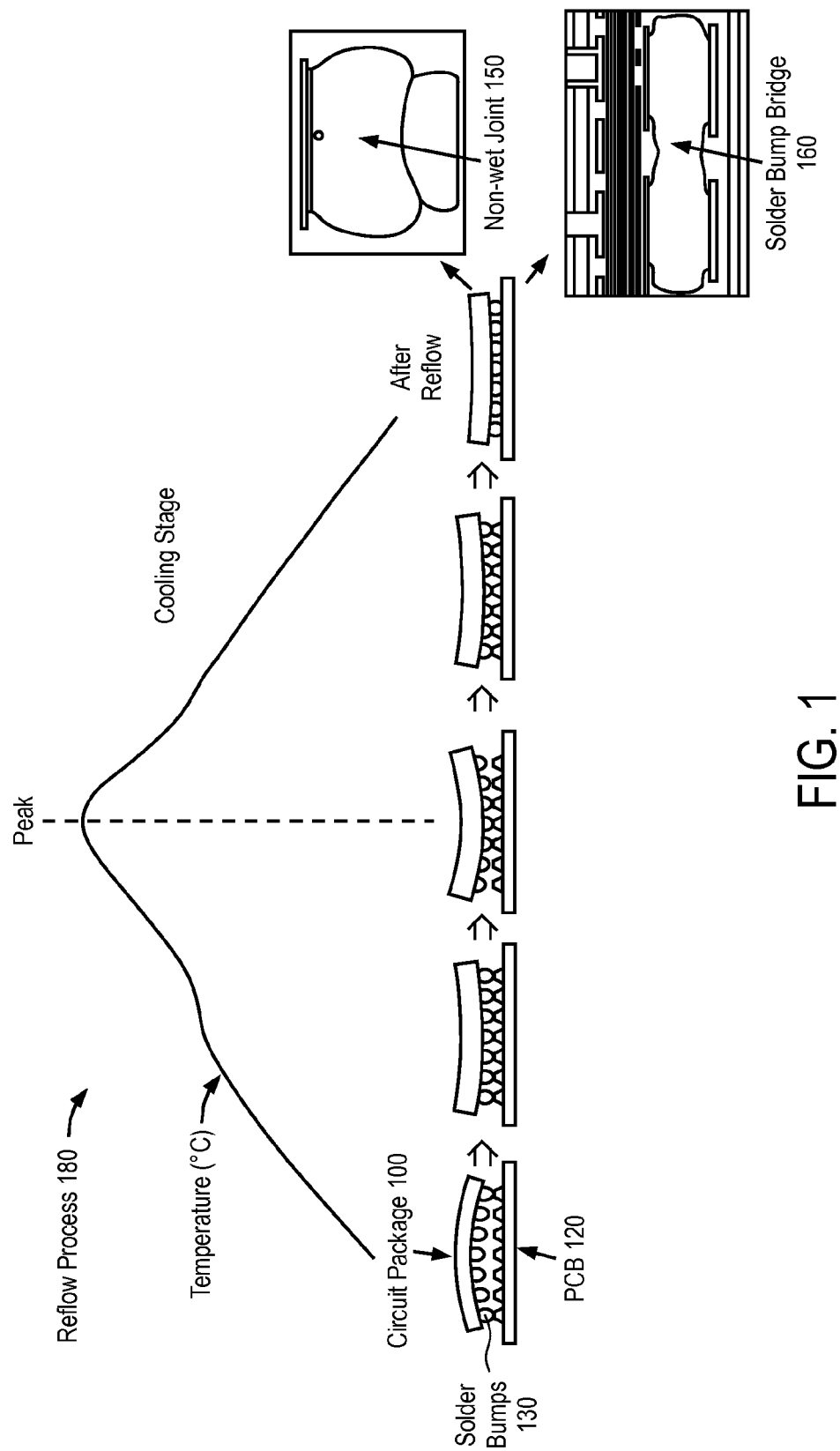
FIG. 1 shows an example of solder joint defects.
Figure 2:
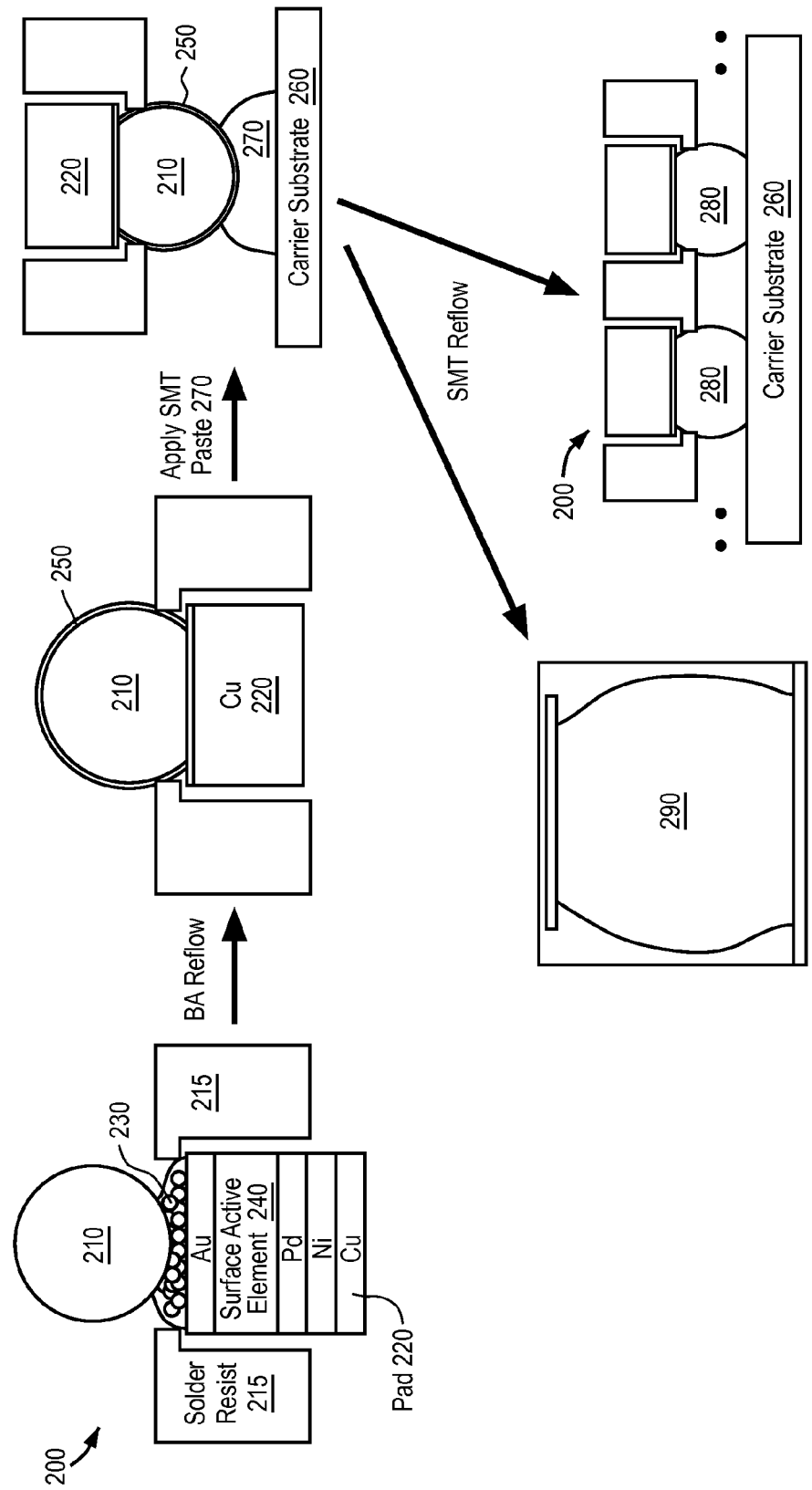
FIG. 2 is a diagram showing an embodiment of adding surface-active dopants into a package substrate.

FIG. 2 shows a cross-sectional view of a portion of a circuit package 200 that includes a conductive element (e.g., a solder element 210) and a region adjacent to and to be bonded with solder element 210. Solder element 210 may be formed by tin (Sn) based material, Indium (In) based material, or other suitable solder materials. Although one solder element 210 is shown, it is understood that circuit package 200 may include an array or a matrix of solder elements for forming an electrical and mechanical connection with a carrier substrate, such as a printed circuit board (PCB) or another component package. The region of circuit package 200 adjacent to, and to be bonded with, solder element 210 includes a pad 220 within the substrate of circuit package 200 (referred to as the package substrate) and a bonding material (e.g., solder paste 230) applied on top of pad 220. Pad 220 may include a number of metal layers (e.g., a copper (Cu) layer, a nickel (Ni) layer, a palladium (Pd) layer and a gold (Au) layer) for forming an electrical connection to the circuitry in circuit package 200. Solder paste 230 can be a mixture of powdered solder and flux. The powdered solder may be a tin (Sn) based alloy, and the flux may be a type of resin acid. In one embodiment, solder paste 230 may include the flux only.

FIG. 2 also shows solder resist 215 adjacent to pad 220. Solder resist 215 may be a layer of polymer coating that covers the areas of the package substrate that are not to contact molten solder. For example, the covered areas may contain wiring or conductive material, which may form a short circuit upon contact to molten solder.

According to one embodiment of the invention, pad 220 may include a layer 240 of surface-active dopants (e.g., Germanium (Ge), Boron (B) or Rhenium (Re)). The term "surface-active dopants" refers to dopants that diffuse to the surface upon the application of heat. For example, a ball attach (BA) reflow process may be performed to bond solder element 210 to the package substrate. During the BA reflow, circuit package 200 (including the package substrate, solder paste 230 and solder element 210) is heated above the melting temperature of the solder material (e.g., Sn-based alloy). The heat activates the surface-active dopants, which diffuse to the surface of solder element 210 and create an oxide passivation layer 250 as a protective barrier layer to prevent oxidation of solder element 210.

After the BA reflow, solder element 210 is bonded with pad 220. Oxide passivation layer 250 is formed on the surface of solder element 210 to prevent or reduce the formation of Sn oxide. Oxide passivation layer 250 is a passivation protective layer, which is made up of an oxide complex of the surface-active dopants (e.g., GeO, GeO2, etc.) that are bound to Sn and other alloying elements in the solder (e.g., Ag, Cu, etc.).

Oxide passivation layer 250 prevents Sn oxidation which causes the defects mentioned above. The Cu layer remains in pad 220 after the BA reflow. The other metal layers (e.g., Ni, Pd and Au layers) that were previously within pad 220 before the BA reflow react with the molten solder. The reaction forms inter-metallic elements that may diffuse into the bulk of solder element 210.

A subsequent reflow process, such as a surface mount (SMT) reflow, may be performed to bond circuit package 200 to a carrier substrate 260 (e.g., a PCB). In some embodiments, the subsequent reflow process may be performed to bond circuit package 200 to another component substrate (e.g., a package-on-package assembly). Thus, it is understood that the SMT reflow described in the following may be a heating process for bonding components that are different from a circuit package and a PCB. A bonding material, such as a SMT solder paste 270, may be applied between solder element 210 and carrier substrate 260. SMT solder paste 270 may be a mixture of powdered solder and flux. The powdered solder may be a tin (Sn) based alloy, and the flux may be a type of resin acid. In one embodiment, SMT solder paste 270 may include the flux only.

During the SMT reflow, the assembly of circuit package 200, carrier substrate 260 and SMT solder paste 270 are heated above the melting temperature of the solder material. With oxide passivation layer 250 on the surface of solder element 210, rapid wetting and uniform solder joint formation can be achieved between circuit package 200 and carrier substrate 260. Further, as a result of rapid wetting, defects caused by solder bump bridging can be greatly reduced. Solder bump bridging is generally a byproduct of non-wet joints. Oxide passivation layer 250 helps to reduce the defects caused by solder bump bridging.

After the formation of the solder joint to carrier substrate 260, surface oxides and oxide passivation layer 250 can be removed by the flux in SMT solder paste 270. The solder joint forms a uniform contact without non-wetting defects and without solder bump bridging defects. The solder joint may be part of an array of solder joints 280 between circuit package 200 and carrier substrate 260. An example of such a solder joint in array 280 is shown in diagram 290.

Figure 3:
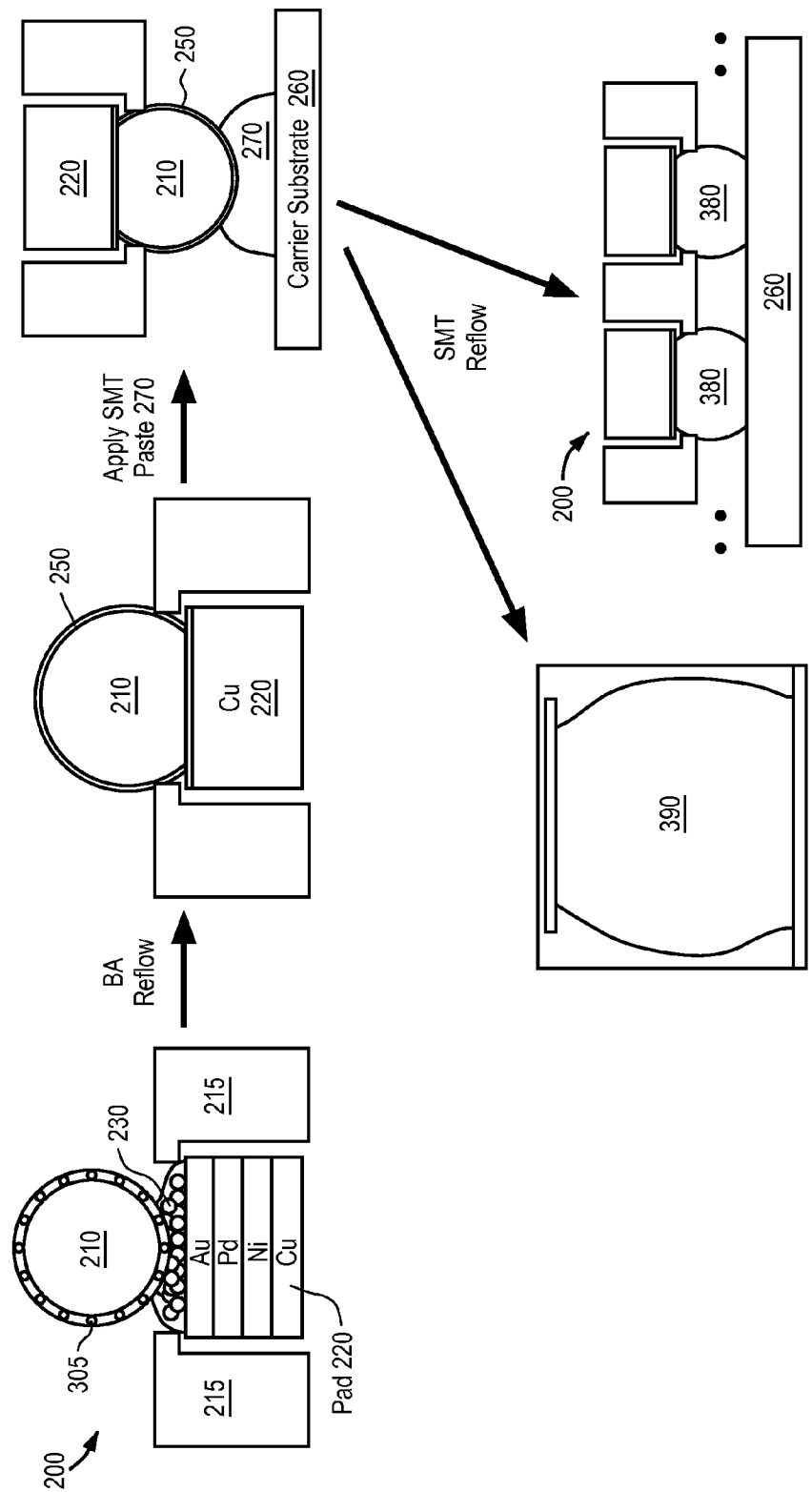
FIG. 3 is a diagram showing another embodiment of depositing surface-active dopants onto a solder element.

Referring to FIG. 3, in one embodiment, the surface-active dopants may be directly deposited onto the surface of solder element 210, instead of, or in addition to, in the metal layers of a pad 220. Initially, a thin layer 305 of the surface-active dopants is directly deposited onto the surface of solder element 210. The dopants may be applied by the known technique for depositing a thin layer, including but not limited to, sputtering, chemical vapor deposition (CVD), plasma vapor deposition (PVD), focused ion beam deposition, etc.

During the BA reflow, the surface-active dopants form oxide passivation layer 250. As mentioned above with reference to FIG. 2, oxide passivation layer 250 prevents or reduces the formation of Sn oxide, which promotes rapid wetting and improves the formation of a uniform solder joint with carrier substrate 260. Further, as a result of rapid wetting, defects caused by solder bump bridging can be greatly reduced. After the SMT reflow, a solder joint 390 is formed without non-wetting defects and without solder bridging defects. Solder joint 390 may be part of an array of solder joints 380 as shown in FIG. 3.

Figure 4:
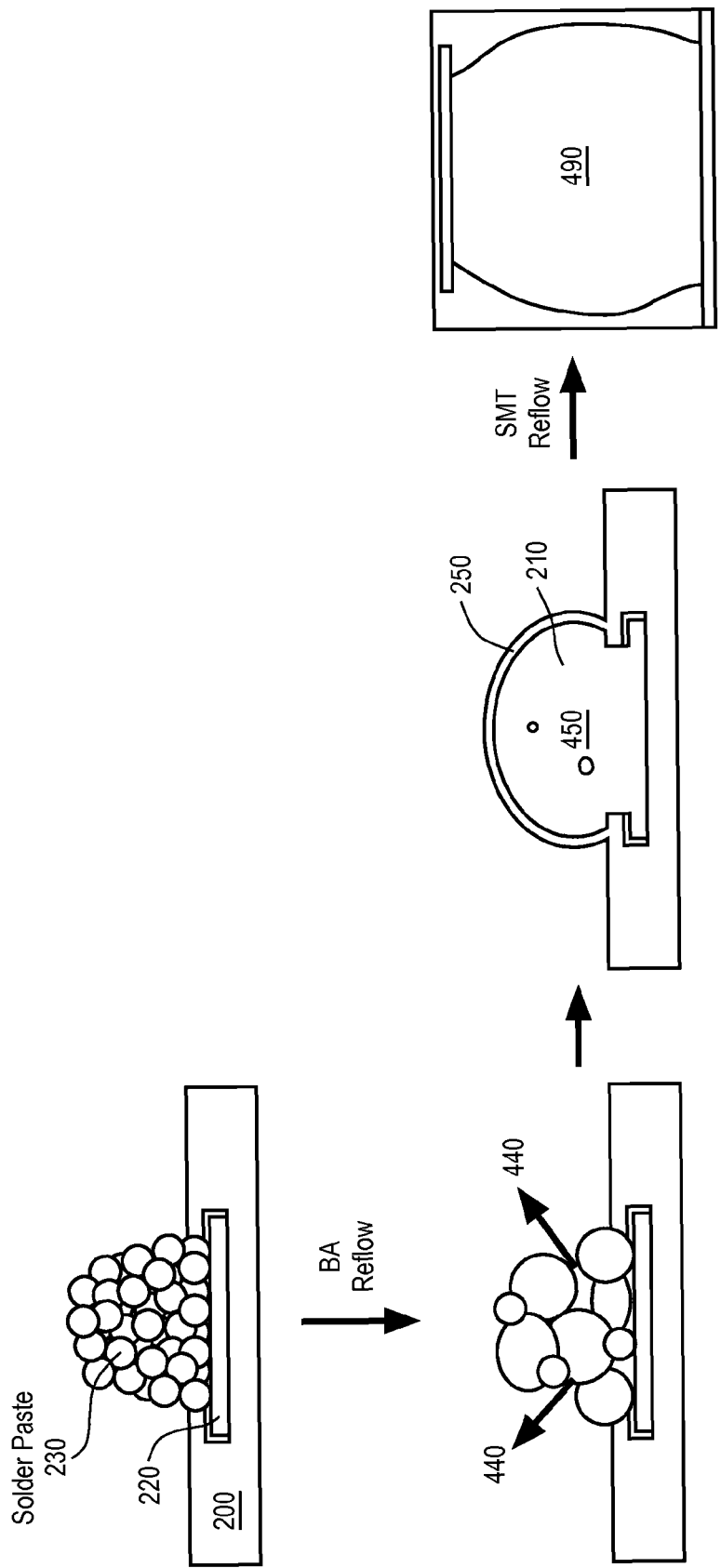
FIG. 4 is a diagram showing an embodiment of adding surface-active dopants to solder paste.

Referring to FIG. 4, in one embodiment, the surface-active dopants may be added to solder paste 230 before the BA reflow. The solder paste includes powdered solder and flux, or only the flux. During the BA reflow process, the flux reacts with oxidized solder (e.g., SnO) and produces water and metal salt residue. The presence of metal salt residue may negatively affect the coalescence of the powdered solder, which in turn causes a large number of large voids to be formed in solder element 210. The large voids usually cause defects (e.g., non-wet joints or solder bump bridging) when bonding circuit package 200 to a carrier substrate.

In an embodiment where surface-active dopants are added to solder paste 230, the surface-active dopants diffuse to the surface of solder element 210 during the BA reflow to form oxide passivation layer 250. Oxide passivation layer 250 prevents or reduces the oxidation of the solder material. Therefore, there is a reduced level of SnO on the surface of solder element 210 and in the solder joint between solder element 210 and pad 220. The reduction of SnO level, in turn, reduces the level of metal salt residue formed by the flux reacting with SnO. The reduction of metal salt residue improves the coalescence of the powdered solder in solder paste 230. As a result, during the BA reflow, volatiles 440 (e.g., gas) can escape more easily and a lesser amount of gas is entrapped in the solder joint to form voids.

Referring to FIG. 4, after the BA reflow, solder element 210 is bonded to package substrate via pad 220. Due to the addition of the surface-active dopants in solder paste 230, there are very few small voids 450, if any, entrapped within solder element 210. The reduction in the number and size of voids in solder element 210, combined with oxide passivation layer 250 that reduces further oxidation of the solder material, improves the bonding to carrier substrate 260. As a result, a solder joint 490 is formed without non-wetting defects and without solder bridging defects.

Figure 5:
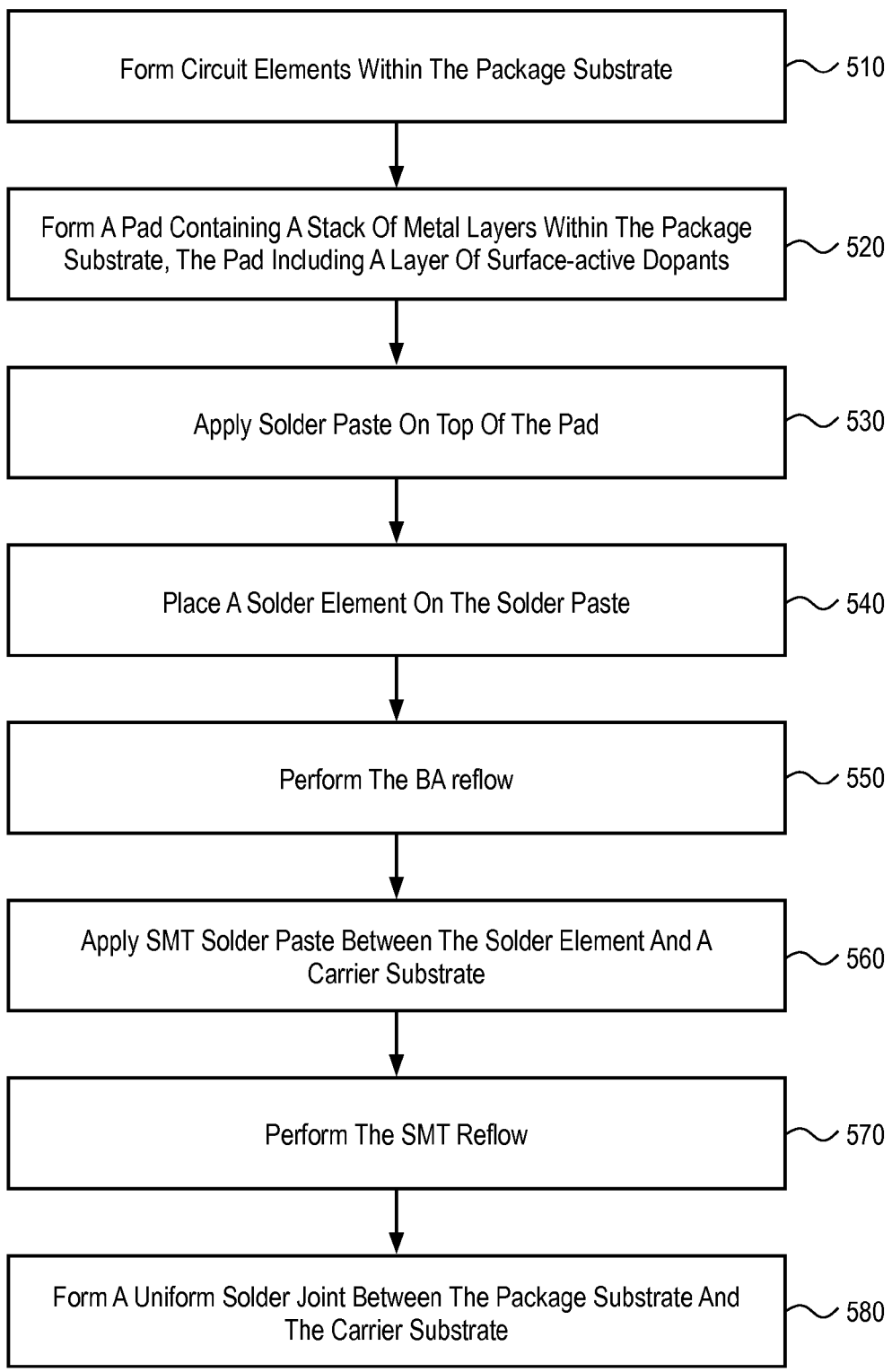
FIG. 5 is a flowchart showing an example of a method performed for mounting a circuit package to a circuit board.

FIG. 5 illustrates an embodiment of a method for interconnecting a circuit package (e.g., circuit package 210) to a carrier substrate (e.g., carrier substrate 260). The embodiment of the method corresponds to the process shown in FIG. 2.

At block 510, circuit elements are formed within the substrate of circuit package 210 (i.e., package substrate). At block 520, a number of pads (e.g., pad 220) are formed within the package substrate, each pad including a stack of metal layers (e.g., Cu, Ni, Pd, Au, etc.). The metal layers can be deposited using a low temperature deposition technique, including but not limited to: chemical vapor deposition, sputtering, electrolytic deposition, and electro-less deposition. In one embodiment, one of the metal layers in the stack contains surface-active dopants, such as Ge, B, or Re.

At block 530, solder paste 230 (which includes powdered solder and flux, or only the flux) is applied on top of pad 220. At block 540, solder element 210 is placed on solder paste 230.

At block 550, a BA reflow is performed by heating circuit package 200 (including the package substrate and solder element 210) approximately 20° C. above the melting temperature of the solder material, which activates the flux as well as the surface-active dopants. The surface-active dopants segregate to the surface of solder element 210, creating a protective barrier layer (i.e., oxide passivation layer 250) against oxidation.

At block 560, SMT solder paste 270 is applied between solder element 210 and carrier substrate 260. At block 570, an SMT reflow is performed by heating circuit package 200 and carrier substrate 260 approximately 20° C. above the melting temperature of the solder material. During the heating process, the flux in SMT solder paste 270 removes the surface oxides and oxide passivation layer 250. Thus, at block 580, solder element 210 forms a uniform contact between circuit package 200 and carrier substrate 260, without non-wetting defects and without solder bump bridging defects.

It is understood that the method of FIG. 5 may be modified to correspond to the processes as shown above with reference to FIG. 3 or FIG. 4. In the embodiment shown in FIG. 3, the surface-active dopants may be deposited onto the surface of solder element 210 after the placement of solder element 210 at block 540 and before the BA reflow at block 550. The deposition of the dopants onto the solder surface may be performed instead of, or in addition to, the deposition of the dopants into pad 220. In the embodiment shown in FIG. 4, the surface-active dopants may be added to solder paste 230 at block 530. The addition of the dopants into solder paste 230 may be performed instead of, or in addition to, the deposition of the dopants into pad 220 and/or onto the solder surface.

In one embodiment, the concentration of the surface-active dopants may be in the range of 1 to 10000 ppm after incorporated into the solder element 210 bulk. The concentration of the surface-active dopants deposited into pad 220 may range from a layer of pure dopant (i.e., 100%) to a few ppm. The layer can vary in thickness to accommodate the different concentrations. A typical thickness of oxide passivation layer 250 ranges from 1 to 20 Angstroms Embodiments of the invention enable chip attach, ball attach, package-on-package and board SMT processes. With the embodiments described herein, non-wet solder joints and solder bump bridging can be greatly reduced, and rapid wetting can be greatly enhanced. Additionally, oxide passivation on the surface of solder elements can be controlled by choosing the type of dopants and the concentration level of the dopants.

Figure 6:
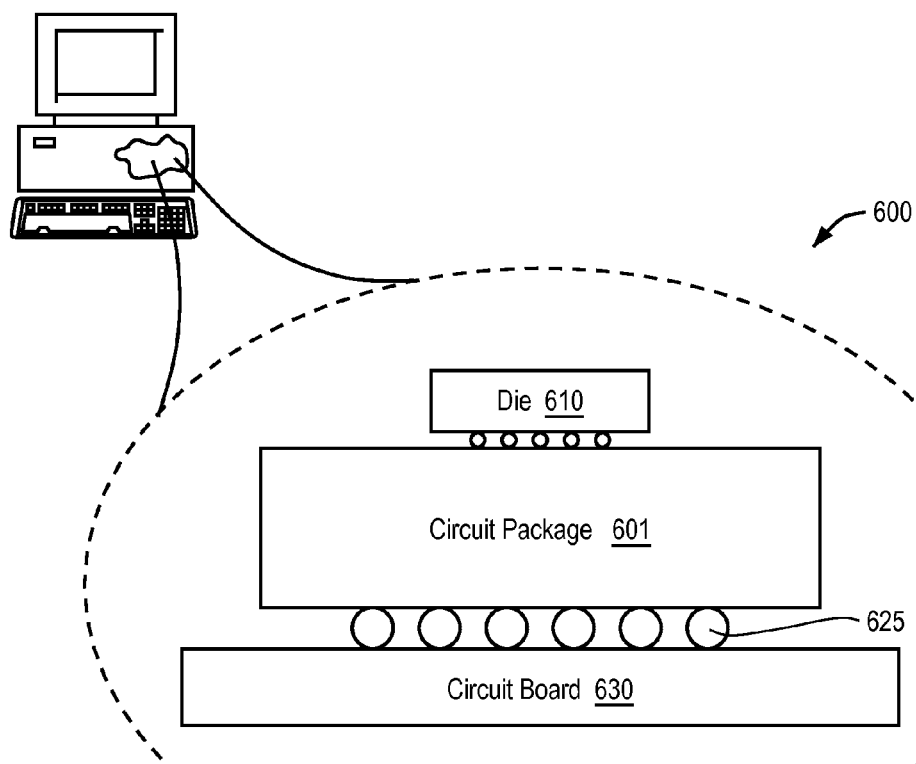
FIG. 6 is a diagram showing an embodiment of a computer system.

FIG. 6 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanners, monitors, etc.), entertainment device (e.g., television, radio, stereo, tape and compact disc player, videocassette recorder, MP3 (Motion Picture Experts Group, Audio Layer 3) player, etc.), and the like. FIG. 6 illustrates an embodiment in which the integrated circuit package is part of a desktop computer.

Referring to FIG. 6, an electronic assembly 600 includes a die 610 (e.g., an integrated circuit die, such as a processor die) physically and electrically connected to the substrate of a circuit package 601. In one embodiment, circuit package 601 includes the portion of circuit package 200 shown in FIGS. 2-4. Electrical contact points (e.g., contact pads on a surface of circuit package 601) are connected to a printed circuit board 630 (e.g., a motherboard or other circuit board) through a conductor bump layer 625. Conductor bump layer 625 may be an array of solder bumps including solder element 210. Embodiments described herein may electrically and mechanically connect circuit package 601 to printed circuit board 630 using conductor bump layer 625.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
forming a layer of surface-active dopants between two metal layers of a pad that is to be bonded to a solder element in a circuit package;
performing a reflow process by heating the circuit package above a melting temperature of the solder element; and
activating the surface-active dopants by the heating to cause the surface-active dopants to diffuse to a surface of the solder element and to form an oxide passivation layer on the surface of the solder element.

2. The method of claim 1, wherein the surface-active dopants are selected from Germanium (Ge), Boron (B) and Rhenium (Re).

3. The method of claim 1, further comprising: depositing the surface-active dopants into the solder element before the reflow process.

4. The method of claim 1, further comprising: depositing the surface-active dopants into solder paste between the solder element and the pad before the reflow process.

5. The method of claim 1, further comprising:
performing a subsequent reflow process to bond the circuit package to a substrate; and
removing the oxide passivation layer by flux during the subsequent reflow process.

6. The method of claim 5, wherein the subsequent reflow process is a surface mount (SMT) reflow process.

7. The method of claim 1, wherein the reflow process is a ball attach reflow process for attaching the solder element to the pad.

* * * * *